(12) United States Patent
Trefonas, III et al.

(10) Patent No.: US 10,191,371 B2
(45) Date of Patent: Jan. 29, 2019

(54) UNDERLAYER COMPOSITION AND METHOD OF IMAGING UNDERLAYER

(71) Applicants: Rohm and Haas Electronic Materials LLC, Marlborough, MA (US); Dow Global Technologies LLC, Midland, MI (US)

(72) Inventors: Peter Trefonas, III, Medway, MA (US); Phillip Dene Hustad, Manvel, TX (US); Cynthia Pierre, Midland, MI (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

(21) Appl. No.: 14/340,938

(22) Filed: Jul. 25, 2014

(65) Prior Publication Data

US 2014/0335454 A1 Nov. 13, 2014

Related U.S. Application Data

(62) Division of application No. 13/253,023, filed on Oct. 4, 2011, now Pat. No. 8,822,133.

(60) Provisional application No. 61/389,527, filed on Oct. 4, 2010.

(51) Int. Cl.
*G03F 7/16* (2006.01)
*G03F 7/40* (2006.01)
*G03F 7/038* (2006.01)
*G03F 7/039* (2006.01)

(52) U.S. Cl.
CPC .......... *G03F 7/0388* (2013.01); *G03F 7/0392* (2013.01); *G03F 7/162* (2013.01); *G03F 7/165* (2013.01); *G03F 7/168* (2013.01); *G03F 7/40* (2013.01)

(58) Field of Classification Search
CPC ........ G03F 7/095; G03F 7/0388; G03F 7/162; G03F 7/40; G03F 7/165; G03F 7/0392
See application file for complete search history.

(56) References Cited

U.S. PATENT DOCUMENTS

| | | | |
|---|---|---|---|
| 6,423,465 B1 | 7/2002 | Hawker et al. | |
| 7,521,094 B1 | 4/2009 | Cheng et al. | |
| 8,822,124 B2 | 9/2014 | Trefonas | |
| 2002/0042017 A1* | 4/2002 | Hatakeyama | G03F 7/0392 430/270.1 |
| 2003/0091752 A1 | 5/2003 | Nealey et al. | |
| 2005/0169957 A1 | 8/2005 | Hossainy | |
| 2006/0134556 A1 | 6/2006 | Nealey et al. | |
| 2007/0042289 A1 | 2/2007 | Thackeray et al. | |
| 2007/0117049 A1* | 5/2007 | Guerrero et al. | G03F 7/0392 430/311 |
| 2007/0142587 A1 | 6/2007 | Baker et al. | |
| 2007/0203303 A1 | 8/2007 | Sogabe et al. | |
| 2008/0248331 A1 | 10/2008 | Gallagher et al. | |
| 2009/0035668 A1 | 2/2009 | Breyta et al. | |
| 2009/0050020 A1 | 2/2009 | Konno et al. | |
| 2009/0104559 A1* | 4/2009 | Houlihan et al. | G03F 7/0392 430/270.1 |
| 2009/0179001 A1 | 7/2009 | Cheng et al. | |
| 2009/0182093 A1 | 7/2009 | Cheng et al. | |
| 2009/0253076 A1 | 10/2009 | Sakaguchi et al. | |
| 2009/0311633 A1 | 12/2009 | Ito | |
| 2010/0167214 A1 | 7/2010 | Yoon et al. | |
| 2010/0233635 A1 | 9/2010 | Shimizu | |
| 2011/0076619 A1 | 3/2011 | Nishikawa | |
| 2011/0143149 A1 | 6/2011 | Shibayama et al. | |
| 2012/0288795 A1 | 11/2012 | Umezaki et al. | |
| 2014/0335455 A1 | 11/2014 | Trefonas, III | |

FOREIGN PATENT DOCUMENTS

| | | | |
|---|---|---|---|
| EP | 0103118 | A1 | 3/1984 |
| EP | 1126321 | A1 * | 8/2001 |
| EP | 1813986 | A2 | 8/2007 |
| JP | 2008076889 | A | 4/2008 |
| WO | 0025178 | A2 | 5/2000 |
| WO | 2010054979 | A1 | 5/2010 |

OTHER PUBLICATIONS

Bang, Joon et al. "Block Copolymer Nanolithography: Translation of Molecular Level Control to Nanoscale Patterns"; Adv. Mater. 2009, 21, 4769-4792.
Black, C. T. "Polymer Self-Assembly as a Novel Extension to Optical Lithography", ACS Nano 2007, 1, 147-150.
Cheng et al. "Dense Self-Assembly on Sparse Chemical Patterns: Rectifying and Multiplying Lithographic Patterns Using Block Copolymers" Adv. Mater. 2008, 20, 3155-3158.
Cheng, J. Y., et al. "Templated Self-Assembly of Block Copolymers: Top-Down Helps Bottom-Up" Adv. Mater. 2006, 18, 2505-2521.
E. Han et al., "Photopatternable Imaging Layers for Controlling Block Copolymer Microdomain Orientation", Advanced Materials, 19, pp. 4448-4452, 2007.

(Continued)

*Primary Examiner* — Cynthia Hamilton
(74) *Attorney, Agent, or Firm* — Cantor Colburn LLP

(57) ABSTRACT

A method of forming a pattern comprises diffusing an acid, generated by irradiating a portion of a photosensitive layer, into an underlayer comprising an acid sensitive copolymer comprising an acid decomposable group and an attachment group, to form an interpolymer crosslink and/or covalently bonded to the surface of the substrate. Diffusing comprises heating the underlayer and photosensitive layer. The acid sensitive group reacts with the diffused acid to form a polar region at the surface, in the shape of the pattern. The photosensitive layer is removed to forming a self-assembling layer comprising a block copolymer having a block with an affinity for the polar region, and a block having less affinity than the first. The first block forms a domain aligned to the polar region, and the second block forms a domain aligned to the first. Removing either the first or second domain exposes a portion of the underlayer.

6 Claims, 5 Drawing Sheets

(56) References Cited

OTHER PUBLICATIONS

Eungnak Han et al. "Effect of Composition of Substrate-Modifying Random Copolymers on the Orientation of Symmetric and Asymmetric Diblock Copolymer Domains" Macromolecules 2008, 41, 9090-9097.

F.K. Hansen, "The Measurement of Surface Energy of Polymers by Means of Contact Angles of Liquids on Solid Surfaces—A short overview of frequently used methods", Department of Chemistry, University of Oslo, pp. 1-12, 2004.

Hamley, I. W. "Nanostructure fabrication using block Nanotechnology copolymers" Nanotechnology 14 (2003) R39-R54.

Ji, S. et al. "Generalization of the Use of Random Copolymers to Control the Wetting Behavior of Block Copolymer Fils" Macromolecules 2008, 41, 9098-9103.

Krausch, G. et al. "Nanostructured Thin Films via Self-Assembly of Block Copolymers" Adv. Mater. 2002, 14, No. 21, Nov. 4. pp. 1579-1583.

M. Ando, "The Printable OTFT Technology for Display Applications", Hitachi Cambridge Laboratory, PEE 2009 Presentation, 33 pages.

P. Mansky et al., "Controlling Polymer-Surface Interaction with Random Copolymer Brushes", Science, 275, pp. 1458-1468, 1997.

Park, Cheolmin et al., "Enabling nanotechnology with self assembled block copolymer patterns" Polymer 44 (2003) 6725-6760.

Ruiz, R. et al. "Induced Orientational Order in Symmetric Diblock Copolymer Thin Films"; Adv. Mater. 2007, 19, 587-591.

Ryu, D. Y. et al. "A Generalized Approach to the Modification of Solid Surfaces" Science (2005), 308, 236-239.

Segalman, R. A. "Patterning with block copolymer thin films" Materials Science and Engineering R 48 (2005) 191-226.

Welander, A. M. et al. "Rapid Directed Assembly of Block Copolymer Films at Elevated Temperatures" Macromolecules 2008, 41, 2759-2761.

\* cited by examiner

UNDERLAYER COMPOSITION AND METHOD OF IMAGING UNDERLAYER

CROSS-REFERENCE TO RELATED APPLICATION

This application is a Divisional Application of U.S. application Ser. No. 13/253,023 filed Oct. 4, 2011, which claims priority to Provisional Application No. 61/389,527, filed on Oct. 4, 2010, the content of which is incorporated by reference herein in its entirety.

BACKGROUND

Block copolymers may be used in directed self-assembly processes to form patterns without requiring a photolithographic process. The block copolymers can form the patterns by assembling on a neutral or patterned surface having neutral and polar regions. Such a neutral or patterned surface can be afforded by use of a polymer brush underlayer.

Polymer brushes are polymeric chains affixed to a surface of a substrate formed of, for example, a semiconductor material. The surface is reactively modified to the desired thickness and surface energy using polymer brush precursors with a desired composition. The composition of a random copolymer underlayer is tuned to afford the desired neutral surface.

For block copolymers capable of self assembly but for which it is unfeasible to synthesize random copolymers of repeating units of each block (such as where different polymerization mechanisms would be required, or where the composition of the brush copolymer is not), end-group functionalization or incorporation of reactive-group containing monomers in the brush copolymer has been performed. (See e.g., P. Mansky, Y. Liu, E. Huang, T. P. Russell, C. Hawker, "Controlling polymer surface interaction with random copolymer brushes", *Science*, 275, 1458, (1997)). Such compositional modifications to the brush copolymer are designed to provide functional sites for grafting. However, there is no disclosure in the art of adjusting the brush polymer composition to change surface polarity lithographically, and hence form a patterned surface on which the self-assembling layer can form.

STATEMENT OF INVENTION

The shortcomings of the prior art are overcome and additional advantages are provided through the provision of, in an embodiment, a method of forming a pattern comprising irradiating a portion of an underlayer comprising an acid sensitive copolymer comprising an acid decomposable group, an attachment group, and a functional group, the attachment group being covalently bonded to a hydrophilic surface of a substrate, crosslinked to form an interpolymer crosslink, or both covalently bonded to the surface of the substrate and crosslinked to form an interpolymer crosslink, and a photoacid generator, wherein the acid decomposable group reacts with an acid generated from the photoacid generator in the irradiated portion of the underlayer to form a polar region at a surface of the underlayer, the polar region having a shape and dimension of the pattern, forming a self-assembling layer on the surface of the underlayer, the self-assembling layer comprising a block copolymer having a first block with an affinity for the polar region, and a second block having less affinity for the polar region than the first block, wherein first block forms a first domain aligned to the polar region, and the second block forms a second domain aligned adjacent to the first domain, and removing either the first or second domain to expose an underlying portion of the underlayer.

In another embodiment, an underlayer comprises an acid sensitive copolymer comprising an acid decomposable group, an attachment group, and a functional group, and a photoacid generator, wherein the attachment group is covalently bonded to a hydrophilic surface of a substrate by alkoxide linkages, is crosslinked to form an interpolymer crosslink, or is both covalently bonded to the hydrophilic surface of the substrate and crosslinked to form an interpolymer crosslink, and wherein the acid decomposable groups are ester groups, acetal groups, ketal groups, pyrocarbonate groups, or a combination comprising at least one of the foregoing acid decomposable groups.

In another embodiment, a self-assembled multilayer film, comprises an underlayer comprising an acid sensitive copolymer comprising an acid decomposable group, an attachment group, and a functional group, and a photoacid generator, wherein the underlayer is disposed on and covalently bonded to a hydrophilic surface of a substrate, crosslinked to form an interpolymer crosslink, or both covalently bonded to the surface of the substrate and crosslinked to form an interpolymer crosslink through the attachment group, and portions of a surface of the underlayer having the acid decomposable groups decomposed to form a patterned surface of the underlayer, and a self-assembling layer disposed on the patterned surface of the underlayer, the self-assembling layer comprising a block copolymer having a first block with an affinity for the portion of the surface of the underlayer having decomposed acid decomposable groups, and a second block having less affinity for the portion of the surface of the underlayer having decomposed acid decomposable groups than the first block, wherein the first block forms a first domain aligned to the portion of the underlayer having the decomposed acid decomposable groups, and the second block forms a second domain on the surface of the underlayer aligned with and adjacent to the first domain.

BRIEF DESCRIPTION OF THE DRAWINGS

The foregoing and other objects, features, and advantages of the invention are apparent from the following detailed description taken in conjunction with the accompanying drawings in which.

DETAILED DESCRIPTION

Figure 1A:
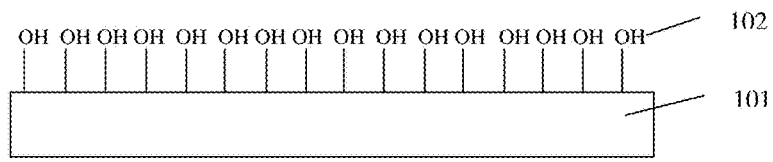
FIGS. 1A-1I show an exemplary method of forming a pattern on a underlayer in one embodiment in which acid is generated in a photosensitive underlayer containing a photoacid generator.

Disclosed herein is a novel brush copolymer underlayer, sometimes referred to herein simply as an underlayer, for directed self-assembly of a block copolymer. The underlayer comprises a random copolymer containing an acid decomposable group, an attachment group, and a functional group, and a photoacid generator. The proportion of the monomers is adjustable to moderate surface energies to match those of a self-assembling block copolymer which is formed on the surface of the underlayer. The underlayer copolymer may be bonded to a hydrophilic surface of a substrate, including a semiconductor substrate such as, e.g., silicon with native oxide or thermally grown oxide, a titanium dioxide layer, etc., to form the underlayer, may be crosslinked with interpolymer crosslinks to form a mat layer, or may form both surface bonds and crosslinks to provide a crosslinked, surface bonded mat layer.

A pattern is formed in the underlayer by including a photoacid generator in the underlayer and directly irradiating the underlayer to generate acid in the irradiated regions of the underlayer that reacts with the acid sensitive copolymer of the underlayer. The exposure pattern of the underlayer may be closely (densely or semi-densely) spaced features of lines, dashes or dots, a sparse pattern of widely spaced lines, dashes, or dots, or combinations of irradiated features.

The method further involves overcoating the patterned underlayer with a block copolymer, annealing the block copolymer so that one block phase separates to align over the deprotected portions of the underlayer containing the acid-decomposed functional groups. A block of the block copolymer is then removed using, e.g., a thermal, photochemical, solvent or plasma method, to create a pattern.

The underlayer comprises an acid sensitive copolymer. The acid sensitive copolymer includes as constituent parts an acid decomposable group, an attachment group, and a functional group.

The relative proportions of the constituent groups are selected such that a desirable balance of properties of these groups, including surface energy and wettability, is obtained for the acid sensitive copolymer before deprotection, and hence for the underlayer prior to any deprotection or in regions where the underlayer is not deprotected. In particular, where the acid sensitive copolymer has not been deprotected, the underlayer including the acid sensitive copolymer has a neutral surface energy toward a self-assembling layer based upon a block copolymer. As used herein, "neutral" means that the surface energy of the underlayer (before deprotection, or in regions where no deprotection has occurred) is comparable to that of the block copolymer. Further, the proportions of the constituent groups are selected such that a desirable balance of properties including layer neutrality of the underlayer before deprotection and polarity of the regions of the acid sensitive copolymer after deprotection, is achieved so that a block copolymer disposed on the patterned surface will form phase-separated domains by block, aligned to the surface.

The acid decomposable group is any group that may be chemically decomposed by contact with an acid of sufficient activity. In an embodiment, the acid decomposable group is a $C_{1-30}$ acid decomposable group comprising an ester group, acetal group, ketal group, pyrocarbonate group, or a combination comprising at least one of the foregoing acid decomposable groups. Alternatively, the acid decomposable group may be a crosslinker or crosslinkable group.

In a specific embodiment, the acid decomposable group is a $C_{4-30}$ tertiary alkyl ester. Exemplary $C_{4-30}$ tertiary alkyl groups include 2-(2-methyl)propyl ("t-butyl"), 2-(2-methyl) butyl, 1-methylcyclopentyl, 1-ethylcyclopentyl, 1-methylcyclohexyl, 1-ethylcyclohexyl, 2-methyladamantyl, 2-ethyladamantyl, or a combination comprising at least one of the foregoing. In a specific embodiment, the acid decomposable group is a t-butyl group or an ethylcyclopentyl group.

The attachment group may be any group containing a reactive functional group capable of forming a bond to a substrate. The bond may be an ionic, coordinative (by, e.g., a metal-ligand bond) or covalent bond to a substrate. Preferably, the bond is a covalent bond. The attachment group may be a hydroxy, thiol, or primary or secondary amine substituted, straight chain or branched $C_{1-30}$ alkyl, $C_{3-30}$ cycloalkyl, $C_{6-30}$ aryl, $C_{7-30}$ alkaryl, $C_{7-30}$ aralkyl, $C_{1-30}$ heteroalkyl, $C_{3-30}$ heterocycloalkyl, $C_{6-30}$ heteroaryl, $C_{7-30}$ heteroalkaryl, $C_{7-30}$ heteroaralkyl or a combination comprising at least one of these groups. As used herein, the prefix "hetero" refers to any non-carbon, non-hydrogen atom including, for example, the halogens (fluorine, chlorine, bromine, iodine), boron, oxygen, nitrogen, silicon, or phosphorus, unless otherwise specified. Exemplary attachment groups include 3-aminopropyl, 2-hydroxyethyl, 2-hydroxypropyl, or 4-hydroxyphenyl. Alternatively, or in addition to these functional groups, other reactive functional groups may be included to facilitate bonding of the acid sensitive copolymer to the surface of a substrate. Exemplary attachment groups include mono-, di- and trialkoxysilane groups such as 3-propyltrimethoxysilane (obtained by the copolymerization of other monomers with trimethoxysilylpropyl (meth)acrylate), glycidyl groups (obtained by the copolymerization with glycidyl(meth)acrylate), or reactive strained rings such as benzocyclobutanes ("BCB," obtained by the copolymerization with, for example, vinyl benzocyclobutane) which may ring open to form reactive dienes which can react with olefinic groups on the surface of the substrate, or with other ring-opened BCB groups in the polymer to form a dimer. As used herein, "(meth)acrylate" refers to an acrylate, methacrylate, or a combination of these.

The functional group, included to adjust the neutrality of the acid-sensitive copolymer, may be a straight chain or branched $C_{1-30}$ alkyl, $C_{3-30}$ cycloalkyl, $C_{6-30}$ aryl, $C_{7-30}$ alkaryl, $C_{7-30}$ aralkyl, $C_{1-30}$ heteroalkyl, $C_{3-30}$ heterocycloalkyl, $C_{6-30}$ heteroaryl, $C_{7-30}$ heteroalkaryl, $C_{7-30}$ heteroaralkyl or a combination comprising at least one of these groups. The functional group may be unsubstituted, or may be substituted with a further functional group including halogen such as fluorine, chlorine, bromine, or iodine; a hydroxy group; an amino group having the structure —N(R')$_2$, where each R' is independently H, cyclic or acyclic $C_{1-30}$ alkyl or $C_{3-30}$ aryl, or fused $C_{2-30}$ alkyl or $C_{3-30}$ aryl; a cyano group; a thiol; a sulfide; a silicon-containing group such as a $C_{1-30}$ alkylsilane, or $C_{6-30}$ arylsilane; a carboxyl containing group such as an aldehyde, ketone, carboxylic acid, ester, or amide; an ether; or a combination comprising at least one of the foregoing. In an exemplary embodiment, the functional group may be a phenyl, 4-methoxyphenyl, hydroxyphenyl, methyl, ethyl, n-propyl, 2-propyl, n-butyl, 2-butyl, isobutyl, or a combination comprising at least one of the foregoing. Optionally, a pendant photoacid generator may further be included as a functional group in the acid sensitive copolymer composition. It will be understood that the acid decomposable groups, attachment groups, and functional groups may be included by copolymerization of corresponding functionalized styrene, olefinic, vinylic, or (meth)acrylate monomers.

In an embodiment, the acid sensitive copolymer has the structure of formula 1:

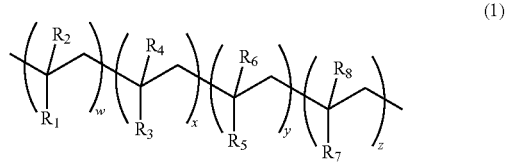

(1)

wherein $R_1$ is a $C_{1-30}$ acid decomposable group comprising a tertiary alkyl ester group, $R_3$ is a $C_{1-30}$ attachment group comprising a hydroxy group, $R_5$ and $R_7$ are independently a $C_{1-30}$ functional group comprising an aromatic group or an ester group, $R_2$, $R_4$, $R_6$ and $R_8$ are independently H or a $C_{1-10}$ organic group, mole fractions w and x are 0.001 to 0.999 and mole fractions y and z are 0 to less than 0.9, where the sum of mole fractions w, x, y, and z is 1. In a specific embodiment, mole fraction x is 0.05 to 0.65, mole fraction y is 0.35 to 0.95, and mole fraction z is 0 to 0.90, where the sum of mole fractions x, y, and z is 1.

In a specific embodiment, the acid sensitive copolymer has the structure of formula 2:

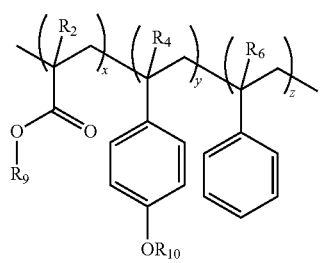

(2)

wherein $R_9$ is a $C_{1-20}$ acid decomposable group comprising a tertiary alkyl ester group, $R_{10}$ is H or a $C_{1-30}$ alkyl group, $R_2$, $R_4$, and $R_6$ are independently H, methyl, ethyl, or phenyl, mole fraction x is 0.05 to 0.65, mole fraction y is 0.35 to 0.95, and mole fraction z is 0 to 0.9, where the sum of mole fractions x, y, and z is 1.

In an exemplary embodiment, the acid sensitive copolymer has formula (3):

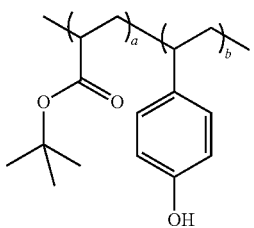

(3)

where mole fraction a is 0.05 to 0.65, and mole fraction b is 0.35 to 0.95, and the sum of mole fractions a and b is 1.

In another exemplary embodiment, the acid sensitive copolymer has formula (4):

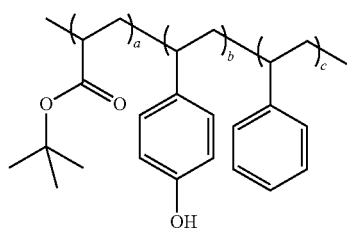

(4)

where mole fraction a is 0.05 to 0.65, mole fraction b is 0.15 to 0.75, and mole fraction c is 0.20 to 0.80, and the sum of mole fractions a, b, and c is 1.

In another exemplary embodiment, the acid sensitive copolymer has formula (5):

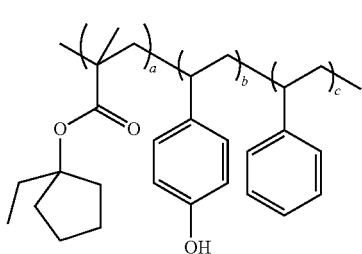

(5)

where mole fraction a is 0.05 to 0.65, mole fraction b is 0.15 to 0.75, and mole fraction c is 0.20 to 0.80, and the sum of mole fractions a, b, and c is 1.

In another exemplary embodiment, the acid sensitive copolymer has the structure of formula (6):

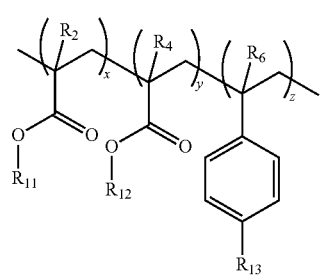

(6)

wherein $R_{11}$ is a $C_{1-20}$ acid decomposable group comprising a tertiary alkyl ester group, $R_{12}$ is a $C_{1-30}$ hydroxy-containing group, $R_{13}$ is H, a $C_{1-10}$ alkyl, or $C_{1-10}$ alkoxy; $R_2$, $R_4$, and $R_6$ are independently H, methyl, ethyl, or phenyl, mole fraction x is 0.05 to 0.65, mole fraction y is 0.35 to 0.95, and mole fraction z is 0 to 0.90, where the sum of mole fractions x, y, and z is 1.

In an exemplary embodiment, the acid sensitive copolymer has the structure of formula (7):

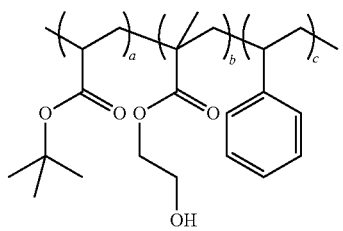

(7)

where mole fraction a is 0.05 to 0.65, mole fraction b is 0.15 to 0.75, and mole fraction c is 0.2 to 0.8, and the sum of mole fractions a, b, and c is 1.

In another exemplary embodiment, the acid sensitive copolymer has the structure of formula (8):

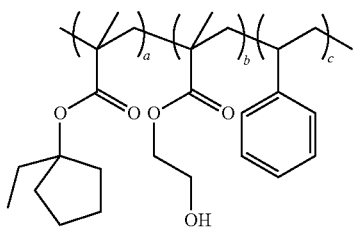

(8)

where mole fraction a is 0.05 to 0.65, mole fraction b is 0.15 to 0.75, and mole fraction c is 0.2 to 0.8, and the sum of mole fractions a, b, and c is 1.

In another exemplary embodiment, the acid sensitive copolymer has the structure of formula (9):

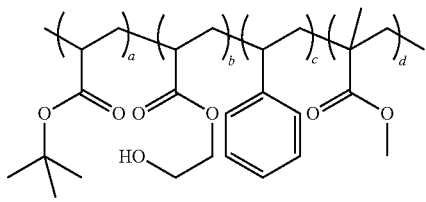

(9)

where mole fraction a is 0.05 to 0.65, mole fraction b is 0.15 to 0.75, mole fraction c is 0.2 to 0.8, mole fraction d is 0.1 to 0.6, and the sum of mole fractions a, b, c, and d is 1.

Additives to impart or enhance additional properties including underlayer properties or coating properties may be included in the solution of the acid sensitive copolymer. Additives may include additional polymers, photoacid generators, thermal acid generators, surfactants including fluorinated surfactants, polyalkyleneoxy surfactants including polyethylene oxides, polypropylene oxides, and copolymers of these; plasticizers' dissolution rate inhibitors (i.e., compounds insoluble in aqueous base); dissolution rate enhancers (i.e., compounds soluble in aqueous base); crosslinkers; catalysts; photocuring agents; adhesion promoters; amine quencher additives (for limiting acid diffusion); or a combination comprising at least one of the foregoing additives.

In an embodiment, the underlayer is a brush layer formed by directly disposing the acid sensitive copolymer composition on the substrate surface and effecting a bond to the substrate (e.g., ionic, coordinative, or covalent). Alternatively, the underlayer is a mat layer either covalently bonded or not covalently bonded to the substrate. The mat layer may include, in addition to the acid sensitive copolymer, a crosslinking component and as needed, a catalyst. In one embodiment, the crosslinking component may be a crosslinker An exemplary acid-catalyzed crosslinker includes an alkoxymethylglycoluril crosslinker such as tetramethoxymethyl or tetrabutoxymethyl glycoluril. Where the crosslinker is an acid-catalyzed crosslinker, an acid such as p-toluenesulfonic acid or its ammonium salt, or a thermal acid generator such as the p-nitrophenyl ester of p-toluenesulfonic acid, may be included. Alternatively, the acid sensitive copolymer itself may further include a monomer capable of forming a crosslink with itself or another functional group on another monomer in the polymer, such as a hydroxy or carboxylic acid group. Exemplary such crosslinking monomers include epoxy-containing monomers such as glycidyl (meth)acrylate, or a trialkoxysilane-containing monomer such as trimethoxysilylpropyl(meth)acrylate as recited above. Where a mat layer requiring an additional component is used, the acid sensitive copolymer may be present in an amount of 50 to 100 wt %, specifically 60 to 99 wt %, more specifically 70 to 95 wt %, and still more specifically 70 to 90 wt %. Also in the mat layer, a crosslinker may be present in an amount of 0 to 50 wt %, specifically 1 to 40 wt %, more specifically 5 to 30 wt %, and still more specifically 10 to 30 wt %. A catalyst, where used, may be included in an amount of 0.1 to 5 wt %. All amounts are based on the based on the total solids content of the mat layer.

In an embodiment, the underlayer further includes a photoacid generator. The underlayer is patterned by disposing an underlayer comprising the photoacid generator on a substrate, irradiating the underlayer with actinic radiation in a pattern to generate acid in the exposed areas.

In this way, directly irradiating the underlayer with actinic radiation generates acid proximate to the acid sensitive groups. The acid sensitive groups of the acid sensitive copolymer in the underlayer then react with the diffused acid to form a polar region at the surface of the underlayer, the polar region having the shape and dimension of the pattern.

Any suitable photoacid generator may be included in the underlayer provided the acid generated by the photoacid generator in the exposed portions of the photosensitive layer has an intrinsic pKa and mobility within the underlayer that is sufficient to diffuse to, react with and decompose the acid sensitive group of the underlayer, under the processing conditions.

The photogenerated acid from decomposition of the photoacid generator may thus have a pKa of less than or equal to 3, specifically less than or equal to 1, and still more specifically less than or equal to 0. The photoacid generator must also be thermally stable to temperatures of up to 250° C. for time periods of up to 10 minutes.

The photoacid generator, included in the photosensitive layer, can in theory generate one equivalent of acid upon absorbance of a quantum of light of an appropriate wavelength, with accompanying by-products. Photoacid generators useful in the photosensitive layer include aryl-based onium salts including include mono-, di- and triarylphosphonium salts, mono- and diaryliodonium salts, sulfonate esters including nadimidosulfonates, aromatic ketones such as benzoin derivatives, or a combination comprising at least one of the foregoing. In an embodiment, where the photoacid generator is included in the underlayer, an aryl-based onium salt such as a mono-, di-, or triarylsulfonium salt or a mono- or diaryliodonium salt having a high thermal stability (relative to, for example, a nadimidosulfonate ester) is used. Exemplary photoacid generators include triphenylsulfonium, n-octylphenyl(diphenyl)sulfonium, and di-t-butylphenyliodonium salts, or nadimidosulfonate esters, of acids such as methanesulfonic acid, benzylsulfonic acid, trifluoromethanesulfonic acid (triflic acid), perfluorobutanesulfonic acid, perfluorobenzenesulfonic acid, trifluoromethylbenzenesulfonic acid, perfluoroethylcyclohexanesulfonic acid, cyclo(1,3-perfluoropropanedisulfonium)imide, or a combination comprising at least one of the foregoing. Specific, non-limiting examples of useful photoacid generators include triphenylsulfonium triflate, triphenylsulfonium perfluorobutanesulfonate, triphenylsulfonium o-trifluoromethylbenzenesulfonate, triphenylsulfonium perfluorobenzenesulfonate, triphenylsulfonium cyclo(1,3-perfluoropropanedisulfonium)imidate, di-t-butylphenyl iodonium triflate, di-t-butylphenyl iodonium perfluorobutanesulfonate, di-t-butylphenyl iodonium o-trifluoromethylbenzenesulfonate, di-t-butylphenyl iodonium perfluorobenzenesulfonate, or a combination comprising at least one of the foregoing.

The photoacid generator may be present in the underlayer in an amount of 0.1 to 10 weight percent (wt %), specifically 0.5 to 8 wt %, more specifically 1 to 7 wt %, and still more specifically 1 to 5 wt %, based on the total solids content of the underlayer.

The underlayer is formed by contacting a solution comprising the acid sensitive copolymer and photoacid generator composition to the substrate. Contacting may be done by spin coating, spray coating, dip coating, or doctor blading.

In an embodiment, the substrate is a semiconductor substrate and contacting is by spin coating. Spin coating comprises dispensing a solution of the acid sensitive brush copolymer onto a surface of the spinning semiconductor substrate. The acid sensitive copolymer is dissolved in a solvent useful for film forming, at a concentration useful for spin-casting and film forming. Exemplary solvents may include, but are not limited to, 1-methoxy-2-propanol, 1-methoxy-2-propyl acetate, ethyl lactate, anisole, cyclohexanone, 2-heptanone, diacetonealcohol, or a combination comprising at least one of the foregoing. The concentration of the acid sensitive copolymer in the solution may be less than or equal to 40 wt %, and in an embodiment, may be from 0.1 to 30 wt %, specifically 0.5 to 20 wt %, and still more specifically 1 to 10 wt %, based on the total weight of the solution.

In an embodiment, the underlayer is applied by spin coating. Conditions for spin coating, where used, are dependent on the substrate diameter and other factors including desired film thickness which depends on the solids content and viscosity of the formulation coated. Spin coating may be carried out at a spin speed of 500 to 4000 rpm, specifically 800 to 3000 rpm, and more specifically 1000 to 2500 rpm.

The underlayer is then heated by baking on a hot plate to remove solvent, condense the film by reducing free volume within the film, and to crosslink and/or attach the acid sensitive polymer to the substrate. Baking of the film may be carried out at a temperature of 50 to 200° C., specifically 60 to 175° C., and more specifically 70 to 150° C. A specific time period for baking is 30 seconds to 5 minutes, more specifically 30 seconds to 3 minutes, and still more specifically 30 seconds to 2 minutes. The brush layer may further be annealed by baking at a temperature of 100 to 300° C., specifically 125 to 275° C., and more specifically 150 to 250° C. A specific time period for annealing is 5 minutes to 10 hours, more specifically 10 minutes to 8 hours, and still more specifically 15 minutes to 6 hours.

The underlayer, and specifically the acid sensitive copolymer, when heated, may attach to the substrate by forming bonds between the attachment groups and the substrate. For example, the acid sensitive copolymer may attach to a substrate having surface hydroxy groups, via a hydroxy containing attachment group, to form e.g., a silyl alkoxide linkage where the substrate comprises silicon dioxide (as either the substrate itself, or as a layer of thermally grown or native oxide, or a spin-on glass, etc.). The substrate having the underlayer so attached is then washed with a solvent to remove any residues of the acid sensitive copolymer. Alternatively, where a mat layer is used, the acid sensitive copolymer crosslinks either by direct polymer-to-polymer crosslinks, or through intermediacy of a crosslinking agent, to form interpolymer crosslinks. The resulting mat layer may or may not be bonded to the substrate.

The underlayer containing the photoacid generator is irradiated in a pattern with actinic radiation. Actinic radiation, useful to generate acid by the photoacid generator is used, where it will be appreciated that the photoacid generator used in the underlayer is sensitive to the radiation wavelength used. The actinic radiation may be, for example, ultraviolet (UV) light having a wavelength of 10 to 400 nm, specific examples of which are i-line radiation of 365 nm, deep ultraviolet (DUV) radiation at 248 nm, 193 nm, 157 nm, and extreme UV radiation of 10-15 nm; x-rays; or electron beam (e-beam).

In a specific embodiment, the photosensitive layer is a photoresist comprising a photoacid generator. The photoresist is a DUV photoresist or a 193 nm photoresist irradiated at a wavelength of 248 nm or 193 nm, respectively.

The pattern formed on the photosensitive layer or the underlayer containing the photoacid generator may have features which form a regular pattern with a dense pitch, i.e., a ratio of linewidth to space width of 1:1 or more (e.g., 1.1:1, 1.2:1, 1.5:1, 2:1, etc.), a semi-dense pitch of less than 1:1 (e.g., 1:1.5) or a sparse pattern having a pitch of 1:2 or less (e.g., 1:3, 1:4, etc.).

A sparse pattern can be formed on the neutral surface of the underlayer using low resolution techniques such as patterns of dashes or dots, rather than using contiguous patterns as would be obtained using unbroken lines. Upon forming the domains on these patterns, the domains align to dashes and/or dots as well as to lines, and due to the ability of domains to align with regularity of size and shape to domains formed on the intermittent patterned regions, the aligned domains can form patterns comparable to those formed on contiguous patterns.

Advantageously, use of lines or dashes with high line-edge roughness and line-width roughness can correct any defects in domain alignment in a "self-healing" mechanism during annealing. In addition, for applications involving electron-beam lithography, writing dashed lines and/or dotted lines takes less writing time (and/or requires a lower energy dose) than writing a solid line, and so the cost and time for preparing the sparse chemical patterns with such non-contiguous lines can each be advantageously reduced. Thus, in an embodiment, an irradiated pattern can be non-contiguous, comprising dashes and/or dots. The spacing and alignment of the dashes and/or dots are such that domains formed on the non-contiguous pattern assemble to form a contiguous pattern of domains in which the incidence of defects is minimized.

In an embodiment, thermal processing to effect a reaction between photogenerated acid and the acid sensitive groups of the underlayer may be carried out by hot plate, by oven/furnace, or other such heating methods. In an embodiment, thermal processing is carried out by heating on a hot plate in a wafer processing and coating track. Heating by hot plate may be carried out under air or in an inert atmosphere such as under nitrogen or helium. Thermal processing may be carried out at ambient temperatures up to 250° C., for time periods of several seconds to several hours, depending on the temperature and the diffusion requirements.

The acid contacting the underlayer in the exposed regions then decomposes the acid decomposable groups on the acid sensitive copolymer to form polar groups defining the polar regions of the patterned underlayer. The regions on the patterned underlayer not exposed to photogenerated acid (i.e., those regions of the underlayer that were not irradiated and where the photoacid generator was not decomposed) remain neutral. In an alternative embodiment, the acid generated in the underlayer in the exposed regions may act to catalyze formation of a neutral region by, for example, crosslinking, and the unexposed regions may be polar, in which instance the domains can align to the unexposed regions.

A self-assembling layer is then formed on a surface of the patterned underlayer. The self-assembling layer comprises a block copolymer having a first block with an affinity for the polar region of the underlayer, and a second, dispersive (also referred to as "neutral") block without an affinity for the polar region of the underlayer. As used herein, "with an affinity for" means that the first block is surface-energy matched to the polar region and is attracted to the polar region, so that during casting and annealing, the mobile first block deposits selectively on and aligns to the polar region. In this way, the first block forms a first domain on the underlayer that is aligned to the polar regions of the underlayer (i.e., is aligned to the pattern formed by decomposition of the acid decomposable groups). Similarly, the second, dispersive block of the block copolymer, which has less affinity for the polar region of the underlayer, forms a second domain on the underlayer aligned adjacent to the first domain. "Domain", as used herein, means a compact crystalline or semi-crystalline region formed by corresponding blocks of the block copolymer, where these regions may be lamellar or cylindrical and are formed orthogonal to the plane of the surface of the underlayer and in at least partial contact with the underlying surface of the underlayer. In an embodiment, the domains may have a shortest average dimension of 1 to 100 nm, specifically 5 to 75 nm, and still more specifically 10 to 50 nm.

The blocks can in general be any appropriate domain-forming block to which another, dissimilar block can be attached. Blocks can be derived from different polymerizable monomers, where the blocks can include but are not limited to: polyolefins including polydienes, polyethers including poly(alkylene oxides) such as poly(ethylene oxide), polypropylene oxide), poly(butylene oxide), or random or block copolymers of these; poly((meth)acrylates), polystyrenes, polyesters, polyorganosiloxanes, polyorganogermanes, or organometallic polymers prepared from polymerizable organometallic monomers based on Fe, Sn, Al, or Ti, such as poly(organophenylsilyl ferrocenes).

In an embodiment, the blocks of the block copolymer comprise as monomers $C_{2-30}$ olefinic monomers, (meth) acrylate monomers derived from $C_{1-30}$ alcohols, inorganic-containing monomers including those based on Fe, Si, Ge, Sn, Al, Ti, or a combination comprising at least one of the foregoing monomers. In a specific embodiment, exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or α-methylstyrene; and can include as (meth)acrylate monomers, methyl(meth)acrylate, ethyl(meth)acrylate, n-propyl(meth)acrylate, isopropyl (meth)acrylate, n-butyl(meth)acrylate, isobutyl(meth) acrylate, n-pentyl(meth)acrylate, isopentyl(meth)acrylate, neopentyl(meth)acrylate, n-hexyl(meth)acrylate, cyclohexyl (meth)acrylate, isobornyl(meth)acrylate, or hydroxyethyl (meth)acrylate. Combinations of two or more of these monomers can be used.

Exemplary blocks which are homopolymers can include blocks prepared using styrene (i.e., polystyrene blocks), or (meth)acrylate homopolymeric blocks such as poly(methylmethacrylate); exemplary random blocks include, for example, blocks of styrene and methyl methacrylate (e.g., poly(styrene-co-methyl methacrylate)), randomly copolymerized; and an exemplary alternating copolymer block can include blocks of styrene and maleic anhydride which is known to form a styrene-maleic anhydride diad repeating structure due to the inability of maleic anhydride to homopolymerize under most conditions (e.g., poly(styrene-alt-maleic anhydride)). It will be understood that such blocks are exemplary and should not be considered to be limiting.

Useful block copolymers include at least two blocks, and may be diblock, triblock, tetrablock, etc. copolymers having discrete blocks, each of which block may be a homopolymer, or random or alternating copolymer. Exemplary block copolymers include polystyrene-b-polyvinyl pyridine, polystyrene-b-polybutadiene, polystyrene-b-polyisoprene, polystyrene-b-polymethyl methacrylate, polystyrene-b-polyalkenyl aromatics, polyisoprene-b-polyethylene oxide, polystyrene-b-poly(ethylene-propylene), polyethylene oxide-b-polycaprolactone, polybutadiene-b-polyethylene oxide, polystyrene-b-poly(t-butyl(meth)acrylate), polymethyl methacrylate-b-poly(t-butyl methacrylate), polyethylene oxide-b-polypropylene oxide, polystyrene-b-polytetrahydrofuran, polystyrene-b-polyisoprene-b-polyethylene oxide, poly(styrene-b-dimethylsiloxane), poly(methyl methacrylate-b-dimethylsiloxane), poly(methyl(meth)acrylate-r-styrene)-b-polymethyl methacrylate, poly(methyl(meth) acrylate-r-styrene)-b-polystyrene, poly(p-hydroxystyrene-r-styrene)-b-polymethyl methacrylate, poly(p-hydroxystyrene-r-styrene)-b-polyethylene oxide, polyisoprene-b-polystyrene-b-polyferrocenylsilane, or a combination comprising at least one of the foregoing block copolymers.

The block copolymer desirably has an overall molecular weight and polydispersity amenable to further processing. In an embodiment, the block copolymer has a weight-averaged molecular weight (Mw) of 10,000 to 200,000 g/mol. Similarly, the block copolymer has a number averaged molecular weight (Mn) of 5,000 to 200,000. The block copolymer can also have a polydispersity (Mw/Mn) of 1.01 to 6. In an embodiment, the polydispersity of the block copolymer is 1.01 to 1.5, specifically 1.01 to 1.2, and still more specifically 1.01 to 1.1. Molecular weight, both Mw and Mn, can be determined by, for example, gel permeation chromatography using a universal calibration method, and calibrated to polystyrene standards.

The block copolymer is, in an embodiment, spin cast from a solution onto the patterned surface of the underlayer to form a self-assembling layer on the surface of the underlayer. The block copolymer is heated to a temperature of up to 250° C. for up to 10 minutes to form the domains in an annealing process. The domains form where the first block forms a first domain on the underlayer aligned to the polar regions, and the second block forms a second domain on the underlayer aligned adjacent to the first domain. Where the irradiated portion of the underlayer forms a sparse pattern, and hence polar regions, spaced at an interval greater than an interval spacing of the first and second domains, additional first and second domains form on the underlayer to fill the interval spacing of the sparse pattern. The additional first domains, without a polar region to align to, instead align to the previously formed second (dispersive) domain, and additional second domains align to the additional first domains.

A relief pattern is then formed by removing either the first or second domain to expose an underlying portion of the underlayer. In an embodiment, the step of removing is accomplished by a wet etch method, developing, or a dry etch method using a plasma.

An exemplary method of an embodiment is illustrated in FIGS. 1A-1I. While the embodiment shown below is that of a brush layer, it will be appreciated that the underlayer may alternatively be a mat layer comprising an acid sensitive copolymer and a crosslinker, and which may or may not be bonded to the substrate. FIG. 1A shows an unmodified semiconductor substrate having hydroxy groups 102 bonded to the substrate material 101. In an embodiment, the hydroxy groups 102 are replaceable hydroxy groups, such as Si—OH groups (where the substrate includes $SiO_2$) or Ti—OH groups (where the substrate includes $TiO_2$).

The polymer brush (i.e., the acid sensitive copolymer) is then attached to the substrate, by a covalent bond. Where a mat layer is used (not shown), the mat layer may or may not be bonded to the surface of the substrate.

Figure 1B:
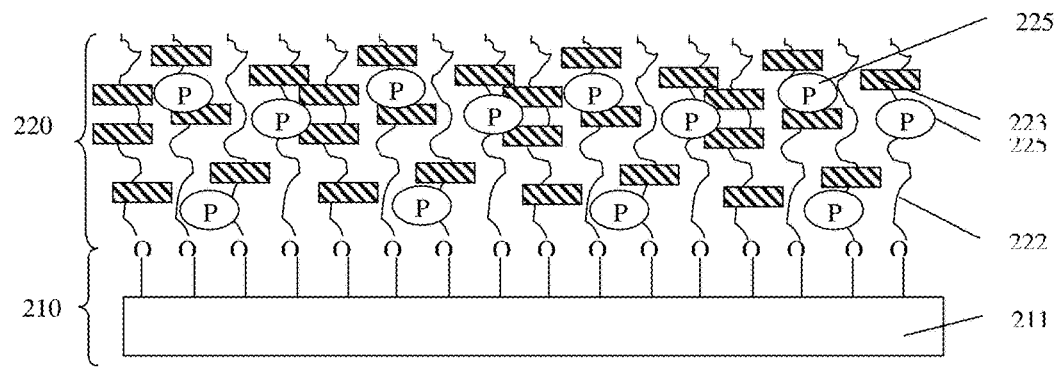

FIG. 1B shows the modified semiconductor substrate 210, in which the semiconductor material 211 has been modified to include an acid sensitive copolymer 222 having acid sensitive groups 223, and connected by bonding through alkoxy linkages to the semiconductor material 211 to form a underlayer 220. A photoacid generator 225, sometimes referred to herein as a "PAG", is dispersed within the underlayer 220. PAG 225 is included with the acid sensitive copolymer in a solvent and the solution is applied to the substrate. PAG 225 may be a discrete molecule, co-dissolved in the underlayer solution, or may be incorporated in the acid sensitive copolymer structure as a covalently or ionically attached group.

Deposition of the underlayer is accomplished by, for example, spin casting a solution of the acid sensitive copolymer which comprises, in addition to the acid sensitive groups 223, an attachment group having at least one hydroxy group (not shown) as a terminal group of the polymer backbone or as a terminal group in a side chain of the acid sensitive polymer (e.g., where the acid sensitive copolymer comprises hydroxystyrene monomer or 2-hydroxyethyl methacrylate (HEMA) monomer as attachment groups). Heating to bond the underlayer 220 via the attachment groups may be carried out at any temperature and time suitable to bond the acid sensitive polymer 222 to the semiconductor material 211. For example, bonding may be carried out on a hot plate at a temperature of 70 to 250° C., for a time of 30 seconds to 2 minutes.

The underlayer 220 is then washed to remove any unbonded acid sensitive copolymer 222. Solvents for washing may include any solvent non-damaging to the acid sensitive groups, attachment groups, or functional groups or which would undesirably result in displacement of the bonded acid sensitive copolymer 222. Exemplary solvents may include toluene, anisole, PGMEA, cyclohexanone, or any solvent capable of removing the residual acid sensitive copolymer. It is understood that where residual acid sensitive copolymer remains on the surface, the residual acid sensitive copolymer can become entrained in a subsequently applied self-assembling layer which may fail to form phase-separated domains as a result.

PAG 225 is selected to have sufficient thermal stability to withstand the incidental and cumulative heating processes the underlayer-coated substrate (layers 210 and 220) is subjected to during processing. Desirable photoacid generators for use as PAG 225 may include arylsulfonium salts including mono-, di-, and triarylsulfonium salts, and diaryliodonium salts including mono- and diaryliodonium salts, where such salts are sufficiently thermally stable to withstand in particular the high temperatures (>100° C.) used to bond the acid sensitive copolymer 222 to the semiconductor material.

Figure 1C:
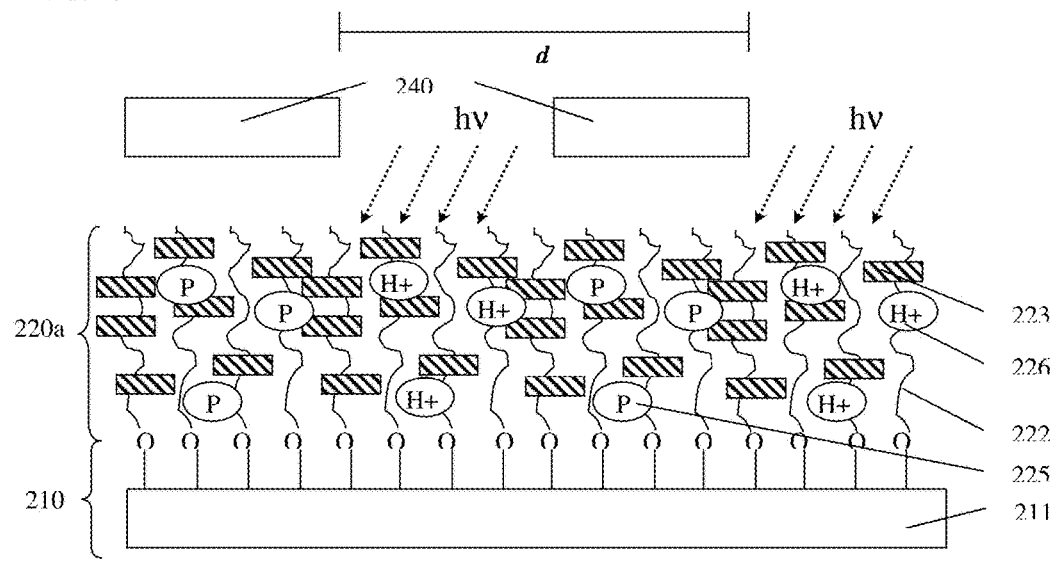

The underlayer 220 is then patterned by irradiating with actinic radiation (hv). As illustrated in FIG. 1C, the underlayer 220 is irradiated through a reticle or mask 240 to form a pattern of irradiation in the underlayer 220 by decomposition of the PAG 225 to form acid 226 in the irradiated region. Also in FIG. 1C (and subsequent FIGS. 1D to 1G), d represents the interval width, across the irradiated surface, of a repeating portion of the irradiated pattern including both irradiated and non-irradiated regions.

Figure 1D:
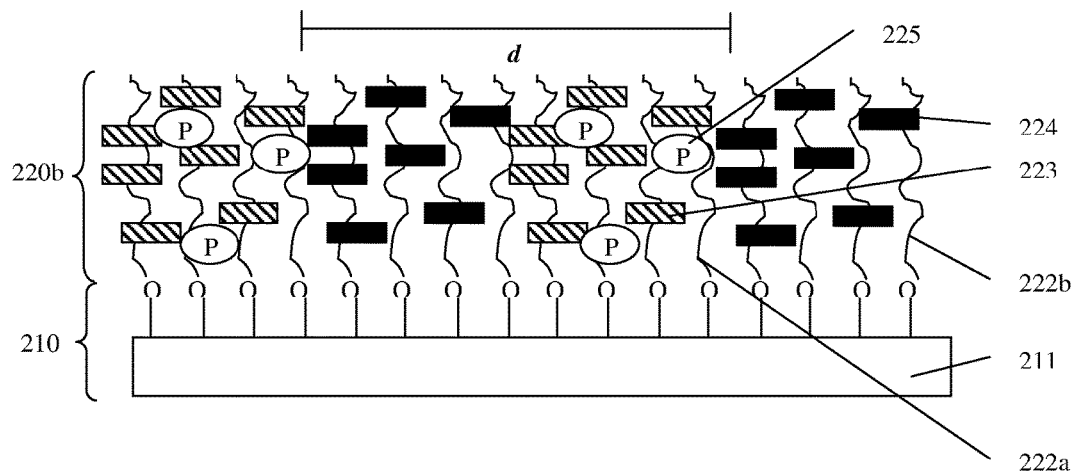

In FIG. 1C, the irradiated underlayer 220a contains acid 226 (H+) in the irradiated portions which decomposes the acid decomposable groups 223 in the irradiated portions of the underlayer 220a. FIG. 1D shows the resulting patterned underlayer 220b, having polar regions of the patterned underlayer 220b comprising polar groups 224 in the reacted acid decomposable copolymer 222b, and neutral regions of the patterned underlayer 220b having undecomposed acid decomposable groups 223 and undecomposed PAG 225 in the unreacted acid sensitive copolymer 222a. Polar groups 224 in the polar region correspond to the irradiated regions of the underlayer 220 as illustrated in FIG. 1C.

Diffusion of the acid generated from PAG 225 is limited to prevent undue broadening of the pattern, and therefore the photoacid generator selected for the patterned underlayer 220b need not have a high acid mobility. For example, acids such as perfluorobutanesulfonic acid or o-trifluoromethyl-benzene sulfonic acid may be used. It will also be appreciated that the acid 226 need only interact with acid sensitive groups at or near the surface of the underlayer 220, sufficient to affect the surface energy in the irradiated portion of the surface of the underlayer 220 forming the polar regions.

Figure 1E:
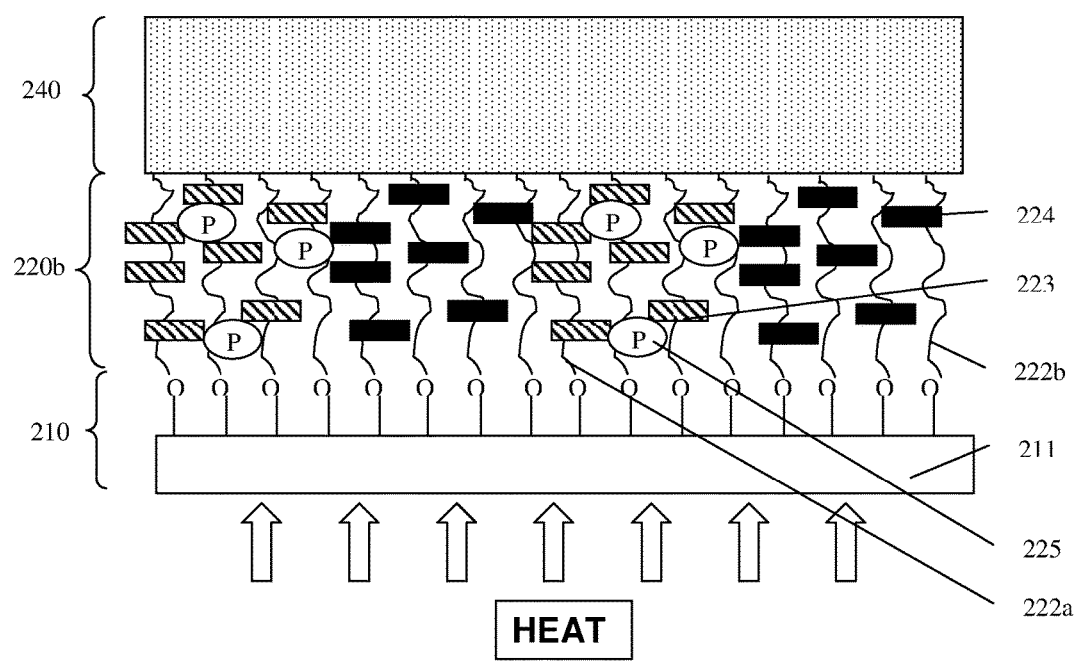

FIG. 1E next illustrates the disposition of a self-assembling layer 240 on a surface of the patterned underlayer 220b. The self-assembling layer 240 may comprise a block copolymer with blocks having different surface energies, where the blocks phase-separate and at least one block forms a discrete domain aligned to the pattern, i.e., the region of the patterned underlayer 220b having the polar groups 224. The self-assembling layer 240 is applied as a solution by spin-casting from a solvent, and after casting is heated to both remove residual solvent and to compact and anneal the self-assembling layer. It is believed that domain formation, which requires mobility of the polymer chains to order the blocks of the block copolymer, occurs simultaneously with the loss of plasticizing solvent during heating and with ordering of the chains of the individual blocks to form ordered cylindrical or lamellar structures.

Figure 1F:
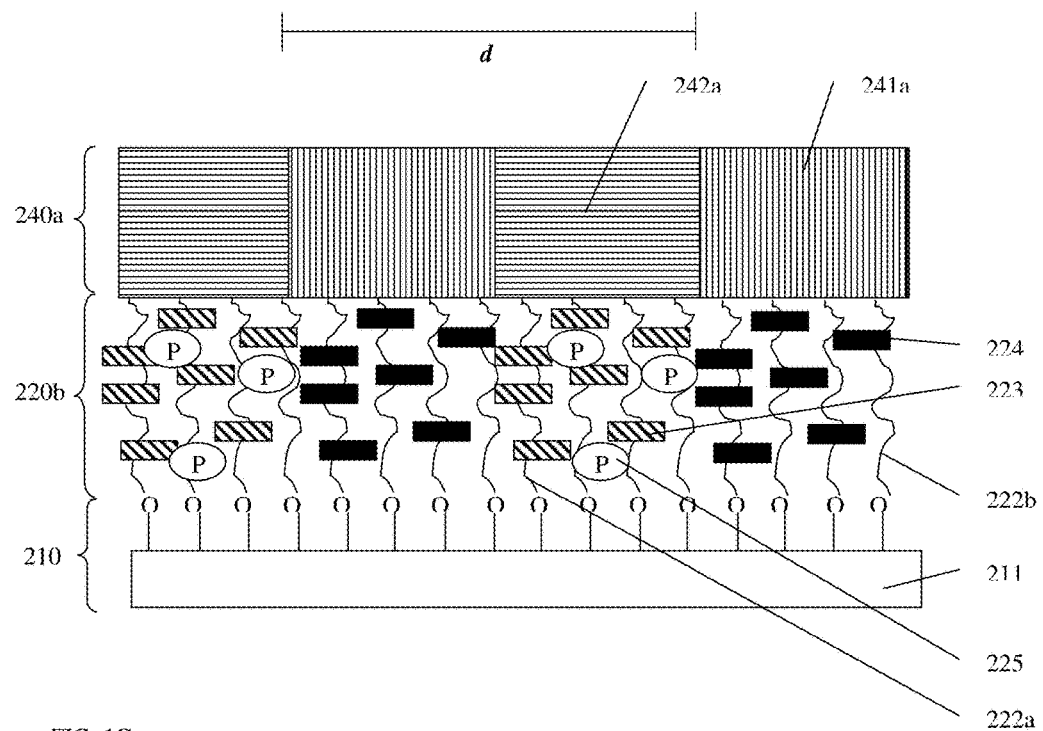

FIG. 1F illustrates the self-assembled layer 240a after domain formation, having domains 241a aligned to the polar regions (with polar groups 224) of patterned underlayer 220a, and neutral domains 242a aligned to polar domains 241a and to the neutral regions (with undecomposed acid decomposable groups 223) of patterned underlayer 220a. It is noted that the interval of the irradiated regions is denoted by d in FIG. 1C to FIG. 1G, where d represents the interval width across the irradiated surface of a repeating portion of the irradiated pattern including both irradiated and non-irradiated regions. While FIG. 1F exemplifies a patterned self assembly layer 240a with interval d which as illustrated corresponds to the width of combined domains 241a and 242a, it will be understood that in other embodiments of a pattern, a sparse pattern may be used.

Figure 1G:
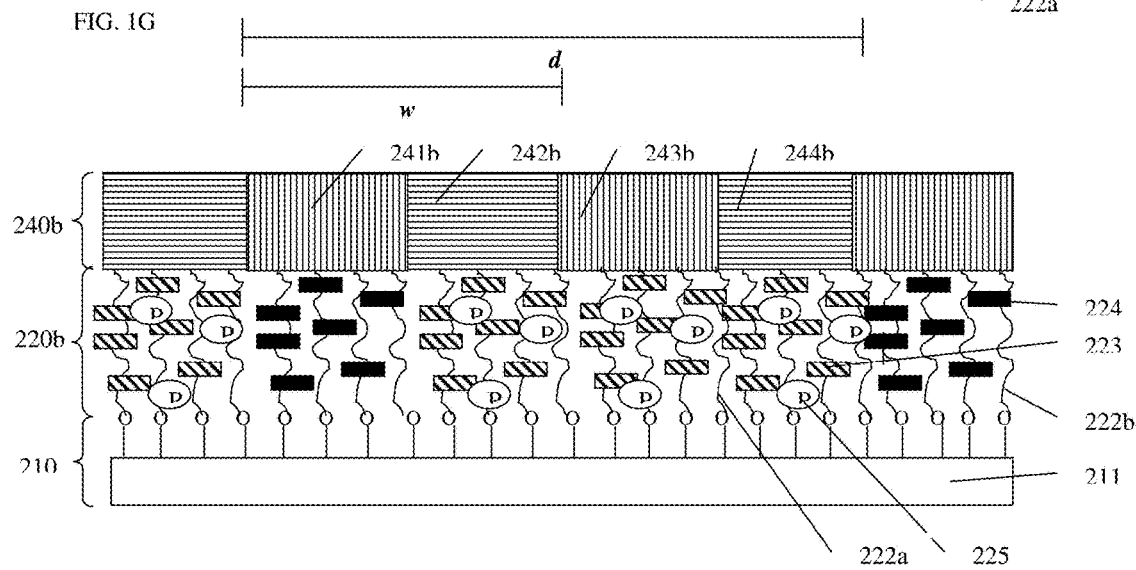

FIG. 1G illustrates self assembly on a sparse pattern, i.e., one where the original irradiated pattern width d is greater than that of the combined widths w of the polar and nonpolar domains (e.g., twice as great where 1 d=2 w, three times as great where 1 d=3 w, etc), rather than one in which the interval of the pattern equals the combined domain width (d=w). Thus, the interval d may coincide with the width w of the combined domains or may exceed the width w (e.g., FIG. 1G, which illustrates a 1 d=2 w ratio).

In FIG. 1G, where the sparse pattern is used, a polar domain 241b of self-assembled layer 240b aligns to the polar region (having polar groups 224) of sparsely patterned underlayer 220b, and a nonpolar domain 242b aligns to the polar domain 241b. A second polar domain 243b aligns to the nonpolar domain 242b, where insufficient polar region of the sparsely patterned underlayer 220b is present, and another nonpolar domain 244b aligns to the second polar domain 243b. The pattern of alignment is then repeated across the surface of the imaged underlayer. In this way, a sparse pattern can be used as a guide, in combination with the domain-forming tendencies of the self-assembling block copolymer, to multiply the pattern without need for irradiating and transferring the complete pattern to the underlayer. This method is especially efficient where dense line/space resolution is difficult to obtain in the irradiation step, or where the irradiation step is a lengthy and time-consuming step (e.g., where e-beam direct writing is used).

Figure 1H:
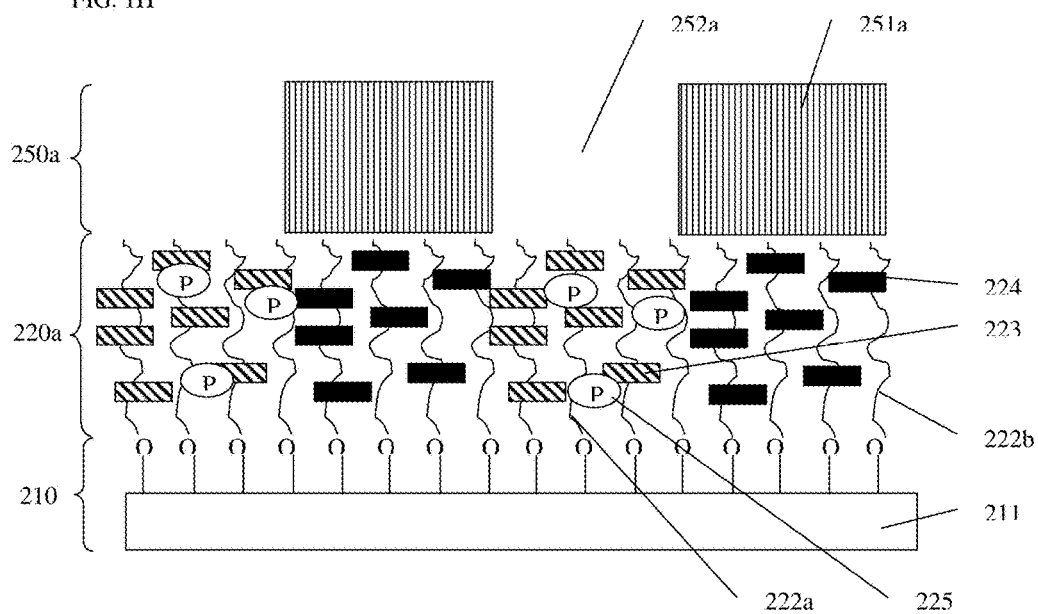

FIG. 1H illustrates the formation of the pattern in relief. A domain 242a in the self-assembled layer 240a from FIG. 1F is selectively removed to provide a pattern layer 250a having positive pattern regions 251a and spaces 252a. Similarly, in FIG. 1I, the domain 241a from FIG. 1F is selectively removed to provide a pattern layer 250b having positive pattern regions 251b and spaces 252b.

Figure 1I:
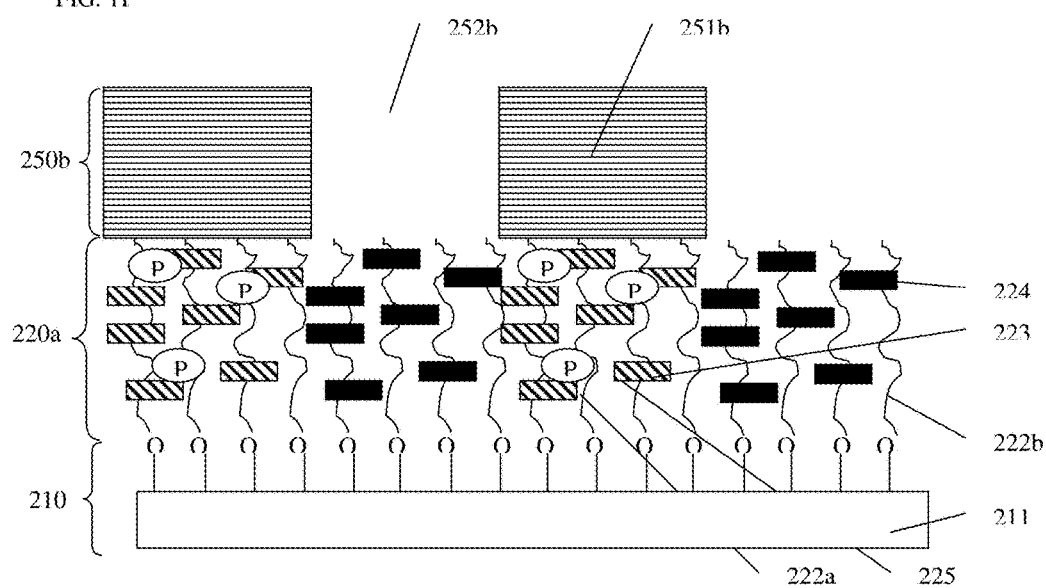

In either of the structures in FIG. 1H or 1I, the underlying nonpolar region (FIG. 1H) or polar region (FIG. 1J) of the brush copolymer layer 220a may also be removed (not shown). Removal may be by a wet chemical treatment including dissolving the blocks, wet etching, or developing using an acid or base developer, or may be accomplished by a selective dry etching process.

The above methods and structures may be used in the manufacture of semiconductor devices including memory devices requiring dense line/space patterns such as synchronous dynamic random access memory (SDRAM) or dense features for data storage such as in hard drives. It will be appreciated that such devices are meant to be illustrative and should not be construed as limited thereto.

The invention is further illustrated by the following examples.

All polymer compositions evaluated as underlayers were prepared as described hereinbelow, except for polyhydroxystyrene (PHS), having an Mw of 10,000 to 25,000 and a polydispersity (Mw/Mn) of less than 2, obtained from Maruzen Corporation. Polymer composition was characterized by $^{13}C$ nuclear magnetic resonance (NMR) spectroscopy and by gel permeation chromatography (GPC). NMR spectra were collected using samples dissolved in chloroform-d or acetone-$d_6$ with 0.9% chromium (III) acetylacetonate as a relaxation agent, with $^1H$ spectral data obtained using a 400 MHz Varian INOVA spectrometer with 10 second pulse delay, and $^{13}C$ spectral data obtained using a 300 MHz Varian INOVA or 400 MHz Bruker AVANCE 400 NMR spectrometer with a cryoprobe and 5 second pulse delay.

Random copolymers of styrene, methyl methacrylate (MMA), hydroxyethylmethacrylate (HEMA), and tert-butyl acrylate (tBA) were synthesized in tetrahydrofuran (THF) at 30 wt % solids via free radical polymerization. All copolymers were produced using the following procedure. The monomers were charged and the reaction mixture was degassed for 30 min., then allowed to equilibrate at 50° C. Upon equilibration, 80% of the targeted 1.50 mol % of VAZO 52 initiator was added. The reaction was heated to 67° C. for 1 h, after which the remaining 20% of the initiator was added. Temperature was maintained overnight under reflux. The polymer was subsequently isolated by precipitating into a 96:4 (w/w) ratio heptane/isopropanol (IPA) solution and the polymer was collected by filtration and dried to constant mass. When the tBA content of the polymer was greater than 12 mol %, the heptane/IPA mixture was cooled with dry ice for at least 1 h prior to precipitation.

The number-average molecular weight ($M_n$) and molecular weight distribution ($M_w/M_n$) of the polymers were determined by gel permeation chromatography, using a cross-linked styrene-divinylbenzene column calibrated with polystyrene standards, and a sample concentration of 1 mg/ml, with THF as eluant at a flow rate of 1 ml/min at 35° C.

The polystyrene-b-poly(methyl methacrylate) ("PS-b-PMMA") copolymer used in the study as the self-assembling copolymer was synthesized by anionic polymerization as follows. An oven dried 1-liter, 3 necked round bottom flask was vacuum/purged with nitrogen and equipped with a magnetic stir bar, nitrogen/vacuum inlet, thermowell and a septum port. To the flask, dry THF (400 mL) and purified styrene (27.8 g, 0.27 mole) was added via cannula and the mixture was cooled to −70° C. Sec-butyllithium (0.71 g of a 0.47 mmole/g solution) was added quickly via cannula and there was an immediate exotherm to −40° C. The reaction mixture turned an orange/red color. The reaction continued for 30 minutes, and diphenylethylene (0.21 g, 1.22 mmole), dissolved in 5 mL dry THF and then added to the reaction whereupon the reaction immediately turned a dark red color. After 30 minutes, a solution of methyl methacrylate (12.79 g, 0.13 mole) in 20 mL of dry THF was added to the −70° C. reaction mixture, with subsequent exotherm to −62° C. accompanied by a color change from dark red to light yellow. After 30 minutes, 2 mL anhydrous methanol was added to quench the reaction. The polymer solution was allowed to warm to ambient temperature and the reaction mixture poured into 1400 mL of stirring methanol. The precipitated solid was isolated by filtration and dried in a vacuum oven at 60° C. for 16 hours to constant weight, yielding 23 g (57% yield) of the polymer as a white polymer.

For evaluation as brush layers, the (meth)acrylate polymers were dissolved in 2-heptanone (2 wt % based on the total solution weight). For evaluation as a mat layer, a formulation of 85 wt % of the acid decomposable (meth) acrylate polymer, 11 wt % of tetra(methoxymethyl)glycoluril, 1 wt % of ammonium p-toluenesulfonate or p-toluenesulfonic acid, and 3 wt % of triphenylsulfonium perfluorobutanesulfonate as a photoacid generator was prepared, and diluted to 2 wt % total solids in 2-heptanone (based on the total solution weight). Both brush layer and mat layer formulations were cast on unprimed 30 cm silicon wafers at 1500 rpm for 30 seconds, followed by a soft bake at 150° C. for 60 seconds to remove solvent and condense the film. The mat layer was then used directly in further evaluations, whereas the brush layer was additionally processed in an annealing step by baking on a hot plate at 160° C. for 4 hours, to covalently bond the acid-decomposable (meth)acrylate polymer to the silicon wafer, and was subsequently rinsed with 2-heptanone twice to remove any unbonded acid decomposable (meth)acrylate polymer.

Measurement of the thickness of the resulting underlayer by atomic force microscopy (AFM) showed a film thickness of 6-7 nm.

Contact angle was measured on a KRÜSS DSA Measurement Tool by the Sessile Drop method using both water (18 ohm deionized water) and methylene iodide ($CH_2I_2$). Surface energy including both polar and dispersive components was calculated from the contact angles of each of these solvents using Fowke's method (a variant of the Owens-Wendt method). The surface energy results are reported in units of millijoules per square meter ($mJ/m^2$).

Copolymers of Ex. 1-4 and comparative copolymers CEx. 3 were prepared by radical polymerization according to the above method from styrene, 2-hydroxyethyl methacrylate, methyl methacrylate, and/or t-butyl acrylate in the molar proportions in Table 1. Note that the polyhydroxystyrene (PHS) for CEx. 1 was used as obtained commercially, and that the poly(styrene-b-methyl methacrylate) diblock copolymer CEx. 2 was prepared by the above described anionic polymerization method.

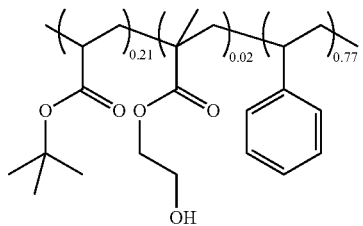

and formulated in 2-heptanone (2 wt % solids based on total solution weight) were coated as described above to form a brush layer and a mat layer. The brush layer sample was coated with photoresist (EPIC™ 2340 photoresist, available from Rohm and Haas Electronic Materials) to a 180 nm film thickness and baked at 110° C. for 60 seconds. The wafers were then exposed at 0, 125, and 250 millijoules per square centimeter ($mJ/cm^2$) using a binary reticle consisting of an array of 180 nm contact holes at a 360 nm pitch across a 6.6

TABLE 1

| Example | Underlayer Polymer Composition (mol %) | | | | | Molecular Weight (g/mol) | | Contact angle (°) | | Surface energy ($mJ/m^2$) | | |
|---|---|---|---|---|---|---|---|---|---|---|---|---|
| | PHS | STY | HEMA | MMA | t-BA | Mn | PD | water | $CH_2I_2$ | dispersive | polar | (dispersive/polar) |
| CEx. 1 | 100 | — | — | — | — | — | — | 84 | 30.8 | 37 | 7 | 0.16 |
| CEx. 2[a] | — | 77 | — | 23 | — | 173,000 | 1.17 | 87.2 | 35.2 | 36 | 6 | 0.14 |
| Ex. 1 | — | 74 | 9 | 5 | 12 | 27,500 | 2.28 | 82.5 | 42.2 | 31 | 9 | 0.22 |
| Ex. 2 | — | 54 | 21 | 8 | 17 | 18,300 | 1.80 | 81.3 | 45.8 | 29 | 10 | 0.26 |
| Ex. 3 | — | 77 | 2 | — | 21 | 15,200 | 1.29 | 85.7 | 35.2 | 36 | 7 | 0.16 |
| Ex. 4 | — | 25 | 10 | — | 65 | 6,893 | 1.87 | 84.7 | 55.5 | 25 | 10 | 0.28 |
| CEx. 3 | — | 68 | 1.5 | 32 | — | 41,900 | 2.36 | 82.5 | — | — | — | — |

[a]Poly(styrene-b-methyl methacrylate) copolymer.

Brush layers were prepared as described above for the polymers in Table 1. As seen in Table 1, a polymer having a composition of 100% polyhydroxystyrene (CEx. 1) and which does not include an acid decomposable group, exhibits dispersive and polar surface energies and a polarity ratio comparable to that of an exemplary diblock copolymer of poly(styrene-b-methyl methacrylate), used in a self-assembling layer (CEx. 2). Examples 1-4 each include acid decomposable groups (t-butyl acrylate, abbreviated t-BA), a dispersive functional group (styrene, abbreviated STY), a hydroxy-functionalized reactive group (2-hydroxyethyl methacrylate, abbreviated HEMA), and Ex. 1 and 2 each further included a filler monomer (methyl methacrylate, abbreviated MMA). CEx. 3 contains STY, HEMA, and MMA but no t-BA. It can be seen in Ex. 1, 2, and 4 that inclusion of higher amounts (10 mol % or more) of HEMA increases the polar component of the surface energy resulting in these copolymers deviating from a close match with CEx. 2 on the dispersive and polar surface energies, and resulting polarity ratios, and hence Ex. 1,2, and 4 are non-neutral and form a non-neutral surface with respect to the control CEx. 2.

However, the composition of Ex. 3 has the same dispersive surface energy (36 $mJ/m^2$) and similar polar surface energy (7 $mJ/m^2$ for Ex. 3, compared with 6 $mJ/m^2$ for CEx. 2) and polarity ratio (0.16 for Ex. 3, compared with 0.14 for CEx. 2), and hence CEx. 2 and Ex. 3 are closely matched and neutral toward one another.

A brush layer and a mat layer composition as described above, comprising the terpolymer of Example 1, having the following structure:

mm×6.6 mm field size, using annular illumination at a maximum numerical aperture (NA) of 0.75 for the exposure tool (ASML PAS 5500/1100 193 nm scanner, manufactured by ASML). After exposure, the photoresist sample was post exposure baked at 120° C. for 60 seconds, followed by developing in 0.26 N tetramethylammonium hydroxide for 60 seconds. The photoresist was subsequently removed using 2-heptanone.

Next, the block copolymer of CEx. 2, having the general structure:

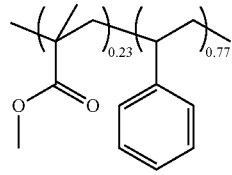

was dissolved in 2-heptanone (2 wt % based on total solution weight) and was spin cast to a thickness of about 100 nm on the 30 cm wafer previously coated with the underlayer comprising the polymer of Example 3 and imaged by the above method, and baked at 250° C. for 60 minutes to anneal the self-assembling layer and provide phase-separated domains as cylinders.

The PS-b-PMMA copolymer structures were analyzed using atomic force microscopy (AFM) in tapping mode at a scanning rate of 0.5 Hz and a drive frequency of ~270 Hz. The domain size and pitch of detected features was determined from a power spectral density (PSD) profile.

Figure 2:
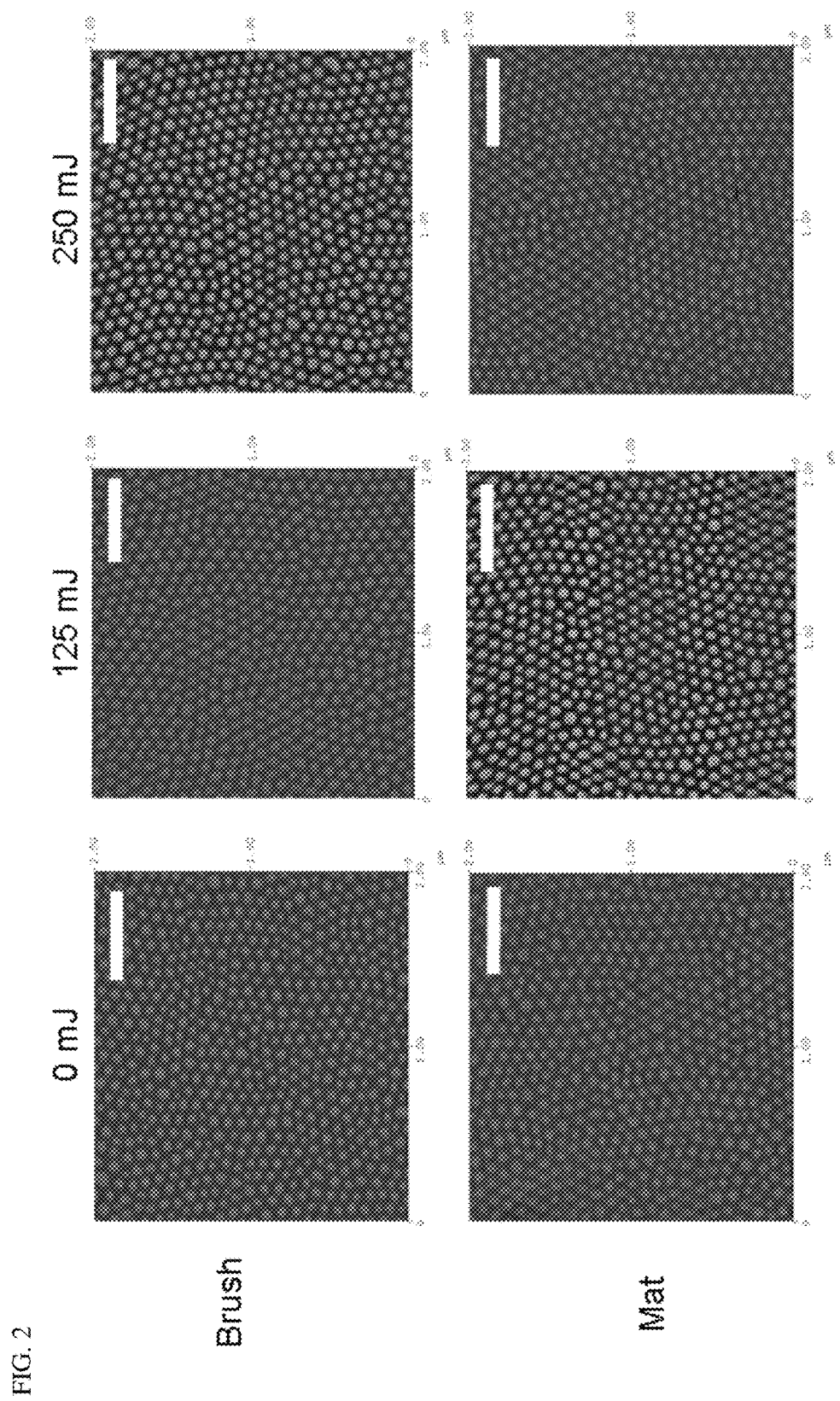
FIG. 2 shows atomic force microscopy (AFM) images of an exemplary patterned self-assembled block copolymer layer on both a brush layer without PAG and an imageable mat layer containing a PAG, patterned to have cylindrical domains.

The samples having the cylindrical domains thereon were then imaged by AFM. FIG. 2 shows a series of AFM images of the samples in a 1 μm×1 μm scan area. The cylindrical domains can be seen in the figure for each sample, and the domain dimensions for the figure are summarized in Table 2, below.

TABLE 2

| | | Exposure dose (mJ/cm$^2$) | | |
| --- | --- | --- | --- | --- |
| | | 0 | 125 | 250 |
| Brush | Domain Size (nm) | 43 ± 6 | 46 ± 5 | 45 ± 5 |
| | Pitch (nm) | 77 | 77 | 74 |
| Mat | Domain Size (nm) | 45 ± 5 | 44 ± 5 | 42 ± 4 |
| | Pitch (nm) | 74 | 77 | 74 |

Both underlayers (brush and mat), each with an acid sensitive methacrylate copolymer composition (Ex. 3) matched to have approximately the same polarity ratio and to be neutral to the PS-b-PMMA copolymer, can provide phase-separated domains aligned to polar regions defined by the exposed contact hole patterns. It can further be seen in FIG. 2 and Table 2 that the best defined features are obtained at lower exposure dose (125 mJ/cm$^2$) than for the brush layer (250 mJ/cm$^2$) in which the acid for deprotection of the (meth)acrylate copolymer of Ex. 1 is diffused into the brush layer from the exposed regions of the photoresist. In both the brush and mat layers, comparable feature size performance is obtained. Advantageously, the mat layer (or a brush layer containing a suitable thermally stable PAG) can be imaged directly, without need for the additional processing steps required for coating and processing a photoresist as the deprotecting acid source for the underlayer. Also advantageously, a mat layer does not require a lengthy annealing process for forming bonds to the substrate, or rinsing to remove unbonded brush layer polymer, further reducing the process cycle time per wafer.

All ranges disclosed herein are inclusive of the endpoints, and the endpoints are independently combinable with each other. The suffix "(s)" as used herein is intended to include both the singular and the plural of the term that it modifies, thereby including at least one of that term. "Optional" or "optionally" means that the subsequently described event or circumstance can or cannot occur, and that the description includes instances where the event occurs and instances where it does not. As used herein, "combination" is inclusive of blends, mixtures, alloys, or reaction products. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. An underlayer comprising:
an acid sensitive copolymer comprising:
an acid decomposable group;
an attachment group; and
a functional group; and
a photoacid generator,
where the functional group is operative to adjust neutrality of the acid-sensitive copolymer relative to a self-assembling block copolymer that is to be disposed on the underlayer, where the neutrality means that a surface energy of the underlayer is substantially the same as that of at least one block of the block copolymer;
wherein the attachment group is covalently bonded to a hydrophilic surface of a substrate by alkoxide linkages where the attachment group comprises a thiol, a primary or secondary amine substituted, a straight chain or branched $C_{1-30}$ alkyl, a $C_{3-30}$ cycloalkyl, a $C_{6-30}$ aryl, a $C_{7-30}$ alkaryl, a $C_{7-30}$ aralkyl, a $C_{1-30}$ heteroalkyl, a $C_{3-30}$ heterocycloalkyl, a $C_{6-30}$ heteroaryl, a $C_{7-30}$ heteroalkaryl, a $C_{7-30}$ heteroaralkyl, or a combination comprising at least one of these groups; and wherein the acid decomposable groups are ester groups, acetal groups, ketal groups, or pyrocarbonate groups.

2. The underlayer of claim 1, wherein the acid sensitive copolymer has the formula:

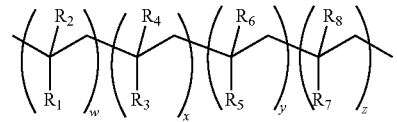

wherein $R_1$ is a $C_{1-30}$ acid decomposable group comprising a tertiary alkyl ester group, $R_3$ is a $C_{1-30}$ attachment group comprising a thiol, or primary or secondary amine group, $R_5$ and $R_7$ represent the functional group and are independently a $C_{1-30}$ aromatic group or ester group, $R_2$, $R_4$, $R_6$, and $R_8$ are independently H or a $C_{1-10}$ organic group, mole fractions w and x are 0.001 to 0.999, mole fractions y and z are 0 to 0.9, and the sum of mole fractions w, x, y, and z is 1.

3. The underlayer of claim 1, where the acid sensitive copolymer has the structure of formula 1:

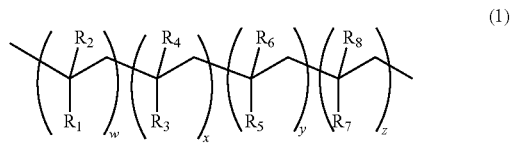

(1)

wherein $R_1$ is a $C_{1-30}$ acid decomposable group comprising a tertiary alkyl ester group, $R_3$ is a $C_{1-30}$ attachment group, $R_5$ and $R_7$ represent the functional group and are independently a $C_{1-30}$ aromatic group or an ester group, $R_2$, $R_4$, $R_6$ and $R_8$ are independently H or a $C_{1-10}$ organic group, mole fractions w and x are 0.001 to 0.999 and mole fractions y and z are less than 0.9, where the sum of mole fractions w, x, y, and z is 1; or has the structure of formula 2:

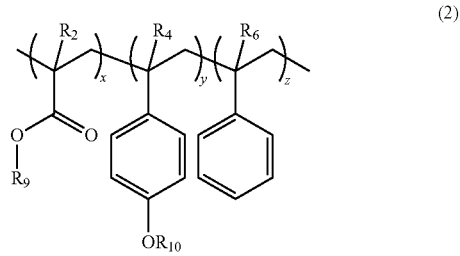

(2)

wherein $R_9$ is a $C_{1-20}$ acid decomposable group comprising a tertiary alkyl ester group, $R_{10}$ is H or a $C_{1-30}$ alkyl group, $R_2$, $R_4$, and $R_6$ are independently H, methyl, ethyl, or phenyl, mole fraction x is 0.05 to 0.65, mole fraction y is 0.35 to 0.95, and mole fraction z is 0 to 0.9, where the sum of mole fractions x, y, and z is 1; or has the structure of formula (3):

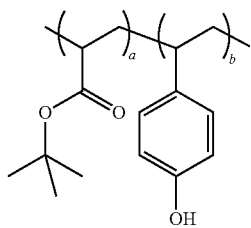

(3)

where mole fraction a is 0.05 to 0.65, and mole fraction b is 0.35 to 0.95, and the sum of mole fractions a and b is 1; or has the structure of formula (4):

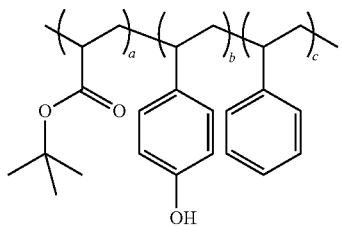

(4)

where mole fraction a is 0.05 to 0.65, mole fraction b is 0.15 to 0.75, and mole fraction c is 0.20 to 0.80, and the sum of mole fractions a, b, and c is 1; or has the structure of formula (5):

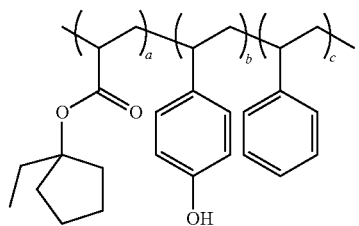

(5)

where mole fraction a is 0.05 to 0.65, mole fraction b is 0.15 to 0.75, and mole fraction c is 0.20 to 0.80, and the sum of mole fractions a, b, and c is 1; or has the structure of formula (6):

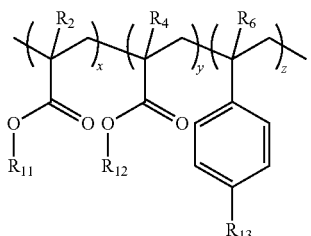

(6)

wherein $R_{11}$ is a $C_{1-20}$ acid decomposable group comprising a tertiary alkyl ester group, $R_{12}$ is a $C_{1-30}$ hydroxy-containing group, $R_{13}$ is H, a $C_{1-10}$ alkyl, or $C_{1-10}$ alkoxy; $R_2$, $R_4$, and $R_6$ are independently H, methyl, ethyl, or phenyl, mole fraction x is 0.05 to 0.65, mole fraction y is 0.35 to 0.95, and mole fraction z is 0 to 0.90, where the sum of mole fractions x, y, and z is 1; or has the structure of formula (7):

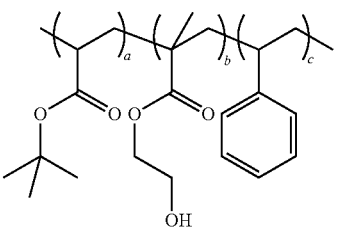

(7)

where mole fraction a is 0.05 to 0.65, mole fraction b is 0.15 to 0.75, and mole fraction c is 0.2 to 0.8, and the sum of mole fractions a, b, and c is 1; or has the structure of formula (8):

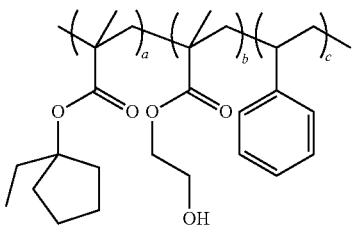

(8)

where mole fraction a is 0.05 to 0.65, mole fraction b is 0.15 to 0.75, and mole fraction c is 0.2 to 0.8, and the sum of mole fractions a, b, and c is 1; or has the structure of formula (9):

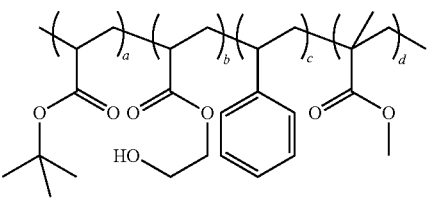

(9)

where mole fraction a is 0.05 to 0.65, mole fraction b is 0.15 to 0.75, mole fraction c is 0.2 to 0.8, mole fraction d is 0.1 to 0.6, and the sum of mole fractions a, b, c, and d is 1.

4. The underlayer of claim 1, wherein the functional group comprises phenyl, 4-methoxyphenyl, hydroxyphenyl, methyl, ethyl, n-propyl, 2-propyl, n-butyl, 2-butyl, isobutyl, or a combination comprising at least one of the foregoing.

5. The underlayer of claim 1, wherein the photoacid generator is at least one selected from a sulfonium salt and an iodonium salt.

6. The underlayer of claim 1, wherein the acid decomposable group is 2-(2-methyl)propyl, 2-(2-methyl)butyl, 1-methylcyclopentyl, 1-ethylcyclopentyl, 1-methylcyclohexyl, 1-ethylcyclohexyl, 2-methyladamantyl, 2-ethyladamantyl, or a combination comprising at least one of the foregoing.

* * * * *